United States Patent [19]

Harari et al.

[11] Patent Number: 4,590,503
[45] Date of Patent: May 20, 1986

[54] ELECTRICALLY ERASABLE PROGRAMMABLE READ ONLY MEMORY

[75] Inventors: Eliyahou Harari, Los Altos; Ranendu M. Das, Fremont, both of Calif.

[73] Assignee: Honeywell Inc., Minneapolis, Minn.

[21] Appl. No.: 516,172

[22] Filed: Jul. 21, 1983

[51] Int. Cl.[4] .................................... H01L 29/78
[52] U.S. Cl. ......................... 357/23.5; 357/23.6; 357/23.14; 365/185
[58] Field of Search .............. 357/23.5, 23.14, 23.6, 357/41; 365/185

[56] References Cited

U.S. PATENT DOCUMENTS

| | | |
|---|---|---|
| 4,087,795 | 5/1978 | Roessler . |
| 4,115,914 | 9/1978 | Harari . |
| 4,119,995 | 10/1978 | Simko . |
| 4,148,044 | 4/1979 | Roessler . |
| 4,162,504 | 7/1979 | Hsu . |
| 4,185,319 | 1/1980 | Stewart . |
| 4,203,158 | 5/1980 | Frohman-Bentchkowsky et al. . |
| 4,209,849 | 6/1980 | Schrenk . |
| 4,228,527 | 10/1980 | Gerber et al. . |
| 4,253,106 | 2/1981 | Goldsmith et al. . |
| 4,257,056 | 3/1981 | Shum . |
| 4,267,558 | 5/1981 | Guterman . |
| 4,272,774 | 6/1981 | Boettcher . |
| 4,288,256 | 9/1981 | Ning et al. . |
| 4,295,150 | 10/1981 | Adam . |
| 4,317,273 | 3/1982 | Guterman et al. . |
| 4,328,565 | 5/1982 | Harari . |
| 4,334,429 | 6/1982 | Kotecha . |
| 4,363,109 | 12/1982 | Gardner ........................ 357/23.5 |
| 4,385,308 | 5/1983 | Uchida ........................ 357/23.5 |
| 4,417,264 | 11/1985 | Angle ........................... 357/41 R |
| 4,417,325 | 11/1985 | Harari .......................... 357/23.6 |
| 4,432,075 | 2/1984 | Eitan ............................ 357/23.5 |
| 4,442,447 | 4/1984 | Ipri ............................... 357/23.5 |
| 4,456,978 | 6/1984 | Morley ......................... 357/23.5 |
| 4,486,769 | 12/1984 | Simko .......................... 357/23.5 |

Primary Examiner—Martin H. Edlow
Attorney, Agent, or Firm—Stephen W. Buckingham

[57] ABSTRACT

A floating gate electrically erasable programmable read only memory (E²PROM) having polycrystalline silicon gates with a control gate on the poly 1 level and a floating gate on the poly 2 level is disclosed.

11 Claims, 1 Drawing Figure

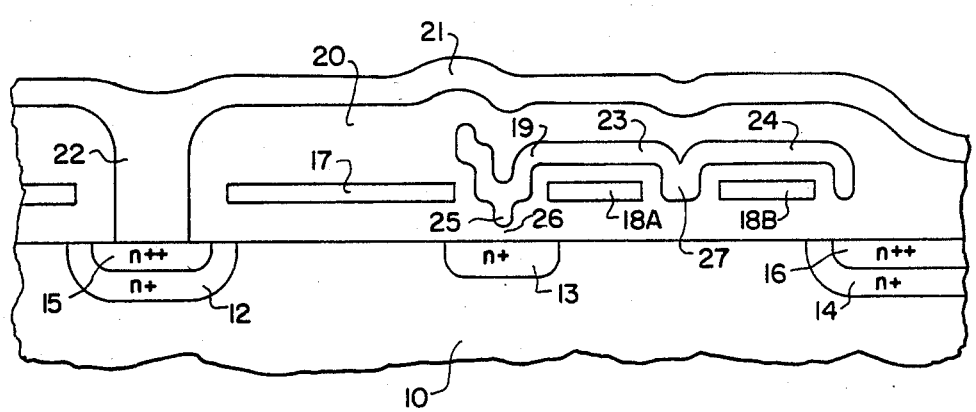

ELECTRICALLY ERASABLE PROGRAMMABLE READ ONLY MEMORY

The present invention relates to electrically erasable programmable read only memories (E²PROM's) and more particularly to those having a polycrystalline silicon floating gate.

BACKGROUND OF THE INVENTION

An E²PROM is a nonvolatile memory device which may be programmed and erased using only electrical techniques. A common type of E²PROM operates as an insulated gate field effect transistor having a source region, a drain region, and a gate region, known as the control gate, and an extra gate region, known as a floating gate. In one type of floating gate E²PROM the floating gate is an electrical conductor or semiconductor, typically polycrystalline silicon, which is encapsulated by a dielectric material. Because of this encapsulation the floating gate has no direct electrical connection with other regions of the device or with structures external to the device. Therefore any change in electrical conditions on the floating gate must result from charge carrier tunneling through the dielectric material.

In a typical floating gate E²PROM the floating gate is provided as a layer of polycrystalline silicon lying between the polycrystalline silicon control gate and the silicon substrate which includes the source, drain, and channel regions. The floating gate is said to be the poly 1 layer because it is the first layer of polycrystalline silicon formed, while the control gate is the poly 2 layer.

SUMMARY OF THE INVENTION

In the present invention an E²PROM is provided with a control gate on the poly 1 level and a floating gate on the poly 2 layer, overlying the control gate.

BRIEF DESCRIPTION OF THE FIGURE

The FIGURE is a cross sectional view of an E²PROM cell of the invention.

DETAILED DESCRIPTION OF THE PREFERRED EMBODIMENT

The sole FIGURE is a cross sectional view of a preferred embodiment of an E²PROM cell of the present invention.

In a typical implementation a plurality of such cells would be formed in a single semiconductor substrate and interconnected by word lines, program lines, and bit lines in a manner known in the art, in order to select the individual cell or cells in use at a given time. The embodiment illustrated in the FIGURE includes a semiconductor substrate 10, typically composed of silicon doped to have p type conductivity. Boron may be used to produce the p type conductivity. Lying within substrate 10 are regions 12, 13, and 14 doped to have n+ type conductivity. Phosphorous may be used as a dopant in regions 12, 13, and 14. Also lying within substrate 10 are heavily doped n++ regions 15 and 16. Overlying substrate 10 are select gate 17, control gate portions 18A and 18B, and floating gate 19. Each of these gate regions is typically polycrystalline silicon. The gate regions are surrounded by dielectric 20 which is typically silicon dioxide. Overlying dielectric 20 is metal bit line 21, typically of aluminum. Connecting bit line 21 to n++ region 22 is metal region 22, also typically of aluminum.

An E²PROM must be able to operate in three modes: write, erase, and read. The operation of the invention in each of these modes will be described. The use of the terms write and erase is somewhat inconsistent in the literature, however. Some authors use the term writing to refer to placing a net electrical charge on the floating gate while others use that term to refer to removing net electrical charge from the floating gate and returning it to an electrically neutral state. In the discussion to follow the word writing will refer to the process of placing a net electrical charge on a floating gate and the term erasing will refer to the process of removing such a net charge.

To write a selected memory cell the appropriate bit line is brought to the system ground voltage and the appropriate word line and program line are brought to the system $V_{pp}$ level, typically 21 volts. As the word line is electrically connected select gate 17 and the program line is electrically connected to control gate portions 18A and 18B, those gates are brought to the $V_{pp}$ level. Bit line 21 is electrically connected to n++ region 15 by metal region 22. As a result n++ region 15 and n+ region 12 are also brought to the system ground voltage. At the same time n+ region 14 and n++ region 16 are maintained at the $V_{ss}$ level which is equal to the system ground level. This results in n+ region 13 also being brought to the system ground voltage.

As explained above control gate portions 18A and 18B are brought to a 21 volt level during the writing process. Capacitive coupling between control gate portions 18A and 18B and floating gate 19 will cause a strong electric field to be formed through thin tunneling dielectric region 26, between n+ region 13 and region 25 of floating gate 19. This electric field increases the probability of electron tunneling through tunneling dielectric 26. As electrons tunnel through tunneling dielectric 26 to floating gate 19, a net negative charge will exist on floating gate 19.

After sufficient charge has accumulated on floating gate 19 the word line is returned to the system ground voltage, which will cause tunneling from n+ region 13 to region 25 of floating gate 19 to cease. Because floating gate 19 is totally surrounded by dielectric 20 there is no conduction path to remove the accumulated charge from floating gate 19. As a result the net electrical charge will remain on floating gate 19 for an extended period of time unless intentionally removed by erasing.

The portion of the memory cell of the FIGURE including region 13, regions 14 and 16, the portion of the p type substrate 10 lying therebetween, and control gate portions 18A and 18B forms an enhancement mode field effect transistor. In order to produce an effective electrical current between region 13 and regions 14 and 16, control gate portions 18A and 18B must be brought to a voltage sufficient to invert the portion of substrate 10 lying between region 13 and regions 14 and 16, i.e. attract sufficient electrons thereto to cause that region to function effectively as an n type region. The voltage thus required is the threshold voltage of the transistor. The cell is designed so that when there is no net electrical charge resident on floating gate 19 the threshold voltage is less than the system $V_{cc}$ level. When a net negative electrical charge resides on floating gate 19 the threshold voltage is increased.

In order to erase a memory cell which has been written as described above, bit line 21 is brought to $V_{pp}$.

This, of course, brings n++ region 15 and n+ region 12 to that voltage. The program line, and hence control gate portions 18A and 18B, are brought to $V_{ss}$ while select gate 17 are brought to the system $V_{pp}$ level. As the structure shown operates as two enhancement mode field effect transistors, the threshold voltage of the transistor including regions 12 and 15 region 13 and select gate 17 being designed to be less than the system $V_{cc}$ and the threshold voltage of the transistor including region 13, regions 14 and 16, and control gate portions 18A and 18B being dependent on the charge on floating gate 19, as described above, these gate voltages allow effective electrical conduction between regions 12 and 15 and n+ region 13, but not between region 13 and regions 14 and 16. This brings region 13 to a high voltage and thus creates a strong electrical field in thin dielectric region 26 between region 13 and region 25 of negatively charged floating gate 19. This increases the probability of electrons tunneling from floating gate 19 through tunneling oxide region 26 to n+ region 13. As electrons tunnel from floating gate 19 to n+ region 13 the net charge on floating gate 19 will be reduced. When the net charge on floating gate 19 reaches zero the memory cell is said to be erased, and the applied voltages are returned to the system ground level.

In order to obtain information stored in the memory cell, the cell must be read. In the read mode, bit line 21, control gate portions 18A and 18B, and select gate 17 are all brought to the $V_{cc}$ level. As a result regions 12 and 15 also go to the $V_{cc}$ level. The $V_{cc}$ level on select gate 17 allows effective electrical conduction between regions 12 and 15 and region 13 raising the voltage level on region 13. If floating gate 19 has no net electrical charge, the $V_{cc}$ level on control gate portions will exceed the threshold voltage of the transistor including regions 13, regions 14 and 16 and control gate portions 18A and 18B. The region of substrate 10 lying between region 13 and regions 14 and 16 will be inverted and effective electrical conduction between n+ region 13 and regions 14 and 16 will occur. Such effective conduction across the entire memory cell between regions 12 and 15 and regions 14 and 16 will cause the voltage level on bit line 21 to be significantly reduced. Alternatively, if a net negative electrical charge resides on floating gate 19, as a result of a write operation the threshold voltage of the transistor including region 13 and regions 14 and 16 will be increased to a value greater than $V_{cc}$. Region 27 of floating gate 19 thus acts as a control region. As control gate portions 18A and 18B are at $V_{cc}$, as described above, and regions 14 and 16 are maintained at $V_{ss}$, the device will function as an enhancement mode field effect transistor with a gate to source voltage equal to $V_{cc}$. Thus, the threshold voltage is not exceeded and effective electrical conduction between region 13 and regions 14 and 16 is prevented. This prevents the voltage on bit line 21 from being pulled down significantly and leaves that voltage substantially equal to $V_{cc}$. The voltage on bit line 21 may be determined in a conventional manner using a sense amplifier which provides the memory output.

The memory cell of the invention provides several advantages over those of the prior art. One advantage lies in the fact that the tunnel oxide region may be formed later in the processing than was possible in the prior art. This is because the tunnel oxide must be formed before the floating gate is formed. By moving the floating gate to the poly 2 level, the formation of the floating gate is moved to a later point in the processing sequence. Hence the tunnel oxide may be formed later. This is an advantage because such a very thin layer of oxide, typically about 100 angstroms thick, can be very sensitive to damage during later process steps, particularly during those steps involving elevated temperatures. By forming the tunneling oxide later in the process, the risk of damage thereto is reduced.

A second advantage lies in the improved capacitive coupling between the control gate and the floating gate. This is because the floating gate is substantially shielded from the substrate by the control gate and hence voltages resident on the substrate will have less effect on the floating gate. Such improved capacitive coupling permits a smaller memory cell size than was possible in the prior art and hence permits a denser memory cell array. Another advantage arises from the relationship between the memory cells in an array and support circuitry on the same integrated circuit chip. Such support circuitry typically includes other field effect transistors. The gates of such support transistors are typically provided on the same poly level as the control gate to ease the processing required to provide electrical interconnections therebetween. If the control gate of the memory cell is on the poly 2 level, the gates of the support transistors will be on that same level and the interpoly dielectric will lie between the gates and the channels of those support transistors thus affecting their performance and operating parameters. Thus, the interpoly dielectric must be designed as a compromise between memory cell performance and support circuitry performance. If, as in the present invention, the control gate is on the poly 1 level, and hence the gates of the support transistors are on the poly 1 level, support transistor performance will be essentially independent of the interpoly dielectric and that dielectric may be tailored exclusively for optimum memory cell performance.

The embodiments of the invention in which an exclusive property or right is claimed are defined as follows:

1. A floating gate electrically erasable programmable read only memory cell comprising:

a semiconductor body having a major surface, said body having first and second regions of a first conductivity type and a first region of a second conductivity type, all adjacent to said first major surface, said first region of said second conductivity type lying between said first and second regions of said first conductivity type;

control gate means overlying a portion of said first region of said second conductivity type and separated therefrom by a dielectric material, electrical conditions on said control gate means being capable of affecting the effective electrical conductivity in said first region of said second conductivity type; and floating gate means having a coupling region, a control region, and a tunneling region, said coupling region overlying said control gate means and being separated therefrom by said dielectric material, said control region being adjacent to said first region of said second conductivity type and separated therefrom by said dielectric material, electrical conditions on said control region being capable of affecting the effective electrical conductivity in said first region of said second conductivity type, and said tunneling region being adjacent to said first region of said first conductivity type and separated therefrom by said dielectric material, said tunneling region being separated from said major surface by a distance which is substantially smaller than that separating said control region from said major surface.

2. The memory cell of claim 1 wherein said semiconductor body comprises silicon.

3. The memory cell of claim 2 wherein said control gate means and said floating gate means each comprise polycrystalline silicon.

4. The memory cell of claim 1 further comprising:
   a third region of said first conductivity type located within said semiconductor body and adjacent to said major surface;
   a second region of said second conductivity type located within said semiconductor body and adjacent to said major surface, said second region of said second conductivity type lying between said first and third regions of said first conductivity type; and
   select gate means adjacent to said second region of said second conductivity type and separated therefrom by said dielectric material, electrical conditions on said select gate means being capable of affecting the effective electrical conductivity in said second region of said second conductivity type.

5. The memory cell of claim 4 wherein said semiconductor body comprises silicon.

6. The memory cell of claim 5 wherein said select gate means, said floating gate means, and said control gate means all comprise polycrystalline silicon.

7. The memory cell of claim 6 wherein said first conductivity type is n type and said second conductivity type is p type.

8. A memory cell array comprising:
   a semiconductor body having a major surface;
   a plurality of bit line means, each of said bit line means being electrically conductive;
   a plurality of word line means, each of said word line means being electrically conductive;
   a plurality of program line means each of said program line means being electrically conductive; and
   a plurality of memory cell means each of said memory cell means comprising:
   first, second, and third regions of a first conductivity type lying within said semiconductor body and adjacent to said major surface, each of said third regions of said first conductivity type being electrically connected to one of said bit line means;
   first and second regions of a second conductivity type lying within said semiconductor body and adjacent to said major surface, said first region of said second conductivity type being located between said first and second regions of said first conductivity type and said second region of said second conductivity type being located between said first and third regions of said first conductivity type;
   control gate means overlying said first region of said second conductivity type and separated therefrom by a dielectric material, electrical conditions on said control gate means being capable of affecting the effective electrical conductivity in said first region of said second conductivity type, each of said control gate means being electrically connected to one of said program line means;
   floating gate means having a coupling region, a control region, and a tunneling region, said coupling region overlying said control gate means and being separated therefrom by said dielectric material, said control region being adjacent to said first region of said second conductivity type and separated therefrom by said dielectric material, electrical conditions on said control region being capable of affecting the effective electrical conductivity in said first region of said second conductivity type, said tunneling region being adjacent to said first region of said first conductivity type and separated therefrom by said dielectric material, said tunneling region being separated from said major surface by a distance which is substantially smaller than that separating said control region from said major surface; and
   select gate means adjacent to said second region of said second conductivity type and separated therefrom by said dielectric material, each of said select gate means being electrically connected to one of said word line means.

9. The memory cell array of claim 8 wherein said semiconductor body comprises silicon.

10. The memory cell array of claim 9 wherein said control gate means, said floating gate means, and said select gate means all comprise polycrystalline silicon.

11. The memory cell array means of claim 10 wherein said first conductivity type is n type and said second conductivity type is p type.

* * * * *